(12) United States Patent  (10) Patent No.: US 8,324,915 B2
Yasumura et al.  (45) Date of Patent: Dec. 4, 2012

(54) INCREASING THERMAL ISOLATION OF A PROBE CARD ASSEMBLY

(75) Inventors: Kevin Y. Yasumura, San Ramon, CA (US); Timothy Blomgren, Tracy, CA (US); Jacob C. Chang, Los Altos Hills, CA (US); Michael W. Huebner, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 746 days.

(21) Appl. No.: 12/275,491

(22) Filed: Nov. 21, 2008

(65) Prior Publication Data

US 2009/0230981 A1 Sep. 17, 2009

Related U.S. Application Data

(60) Provisional application No. 61/036,461, filed on Mar. 13, 2008.

(51) Int. Cl.
*G01R 31/00* (2006.01)
(52) U.S. Cl. ......... 324/750.03; 324/750.06; 324/754.03; 324/762.01
(58) Field of Classification Search ............ 324/750.03, 324/750.06, 754.03, 762.01
See application file for complete search history.

(56) References Cited

U.S. PATENT DOCUMENTS

| | | | |
|---|---|---|---|
| 4,954,774 A | 9/1990 | Binet | |
| 6,064,215 A * | 5/2000 | Kister | 324/756.03 |
| 6,081,110 A * | 6/2000 | Moore et al. | 324/756.03 |
| 6,667,631 B2 * | 12/2003 | Ivanov | 324/750.09 |
| 6,894,523 B2 | 5/2005 | Neeb | |
| 6,972,578 B2 | 12/2005 | Martens et al. | |
| 7,002,363 B2 | 2/2006 | Mathieu | |
| 7,071,714 B2 | 7/2006 | Eldridge et al. | |
| 7,285,968 B2 | 10/2007 | Eldridge et al. | |
| 2004/0207425 A1 * | 10/2004 | Ido | 324/760 |
| 2008/0186040 A1 * | 8/2008 | Hobbs et al. | 324/760 |

* cited by examiner

*Primary Examiner* — Arleen M Vazquez
(74) *Attorney, Agent, or Firm* — Kirton & McConkie

(57) ABSTRACT

A probe card assembly can include an electrical interface to a test system for testing electronic devices such as semiconductor dies. The probe card assembly can also include probes located at a first side of the probe card assembly. The probes, which can be electrically connected to the electrical interface, can be configured to contact terminals of the electronic devices in the test system while the probe card assembly is attached to the test system. The probe card assembly can be configured to impede thermal flow from the probe card assembly to the test system at places of physical contact between the probe card assembly and the test system while the probe card assembly is attached to the test system.

28 Claims, 11 Drawing Sheets

INCREASING THERMAL ISOLATION OF A PROBE CARD ASSEMBLY

CROSS REFERENCE TO RELATED APPLICATIONS

This application is a non-provisional of U.S. Provisional Application 61/036,461 filed Mar. 13, 2008.

BACKGROUND

Semiconductor dies are made many at a time on semiconductor wafers. The dies are typically subjected to various tests and processing. The tests can include testing in a test system in which terminals of the dies are contacted by a probe card assembly that provides an interface between the dies and a tester that controls testing of the dies. Embodiments of this invention can be used during testing of such dies to manage various thermal conditions in and around the probe card assembly.

SUMMARY

In some embodiments, a probe card assembly for use in a test system for testing electronic devices can have an electrical interface to the test system. The probe card assembly can also include probes located at a first side of the probe card assembly. The probes, which can be electrically connected to the electrical interface, can be configured to contact terminals of the electronic devices in the test system while the probe card assembly is attached to the test system. The probe card assembly can be configured to impede thermal flow from the probe card assembly to the test system at each place of physical contact between the probe card assembly and the test system while the probe card assembly is attached to the test system.

In some embodiments, a probe card assembly for use in a test system for testing electronic devices can include probes located at a first side of the probe card assembly. The probes can be for contacting terminals of the electronic devices, which can be in the test system. The probe card assembly can also include a mating structure that can be located at a second side of the probe card assembly. The second side can be opposite the first side. The mating structure can be configured to mechanically engage with a clamping mechanism extending from the test system. The mating structure and clamping mechanism can mechanically stiffen the probe card assembly. The probe card assembly can also include a mechanism for impeding thermal flow from the mating structure to the clamping mechanism.

In some embodiments, a test system can include a housing containing electronic devices to be tested. The test system can also include a test head, which can be disposed above the housing and can have electronics for testing the electronic devices, and the test system can include a probe card assembly attached to the housing. The probe card assembly can also be electrically connected to the test head. Probes for contacting terminals of the electronic devices can be located at a first side of the probe card assembly, and a mating structure can be located at a second, opposite side of the probe card assembly. A clamping mechanism can extend from the test head to engage the mating structure, which can mechanically stiffen the probe card assembly. The test system can include a mechanism for impeding thermal flow from the mating structure to the clamping mechanism.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Figure 1:
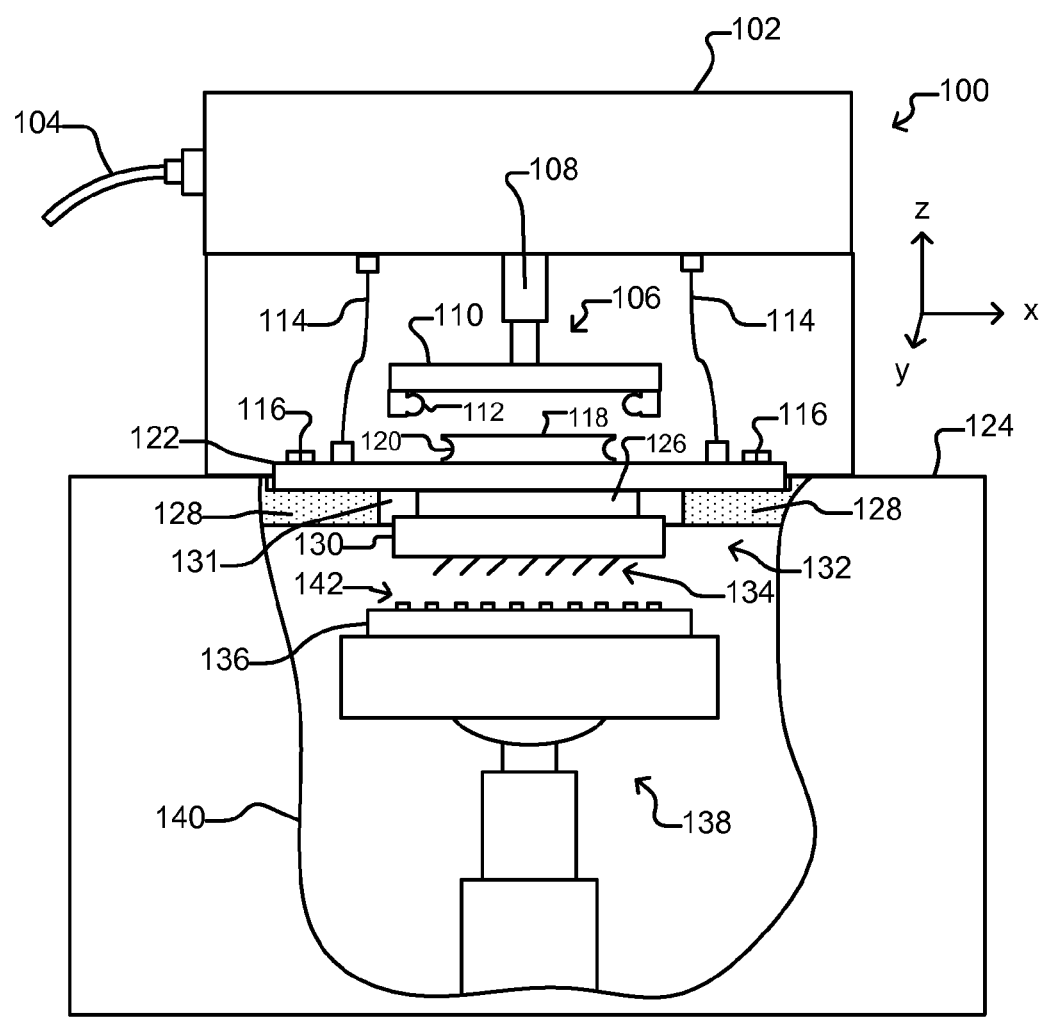
FIG. 1 illustrates an exemplary test system with a clamping mechanism for engaging a mating structure on a probe card assembly according to some embodiments of the invention.

FIG. 1 illustrates an exemplary test system 100 according to some embodiments of the invention. Test system 100 can be used to test one or more electronic devices under test hereinafter referred to as DUT 136 (which can be a non-limiting example of an electronic device or electronic devices). (DUT 136 can be one or more electronic devices under test, including, without limitation, one or more dies of an unsingulated semiconductor wafer, one or more semiconductor dies singulated from a wafer (packaged or unpackaged), one or more dies of an array of singulated semiconductor dies (packaged or unpackaged) disposed in a carrier or other holding device, one or more multi-die electronics modules, one or more printed circuit boards, and/or any other type of electronic device or devices.) The test system 100 of FIG. 1 can include a test head 102, which can include electronics for testing DUT 136, and a prober 124 (which is shown with a cut-away 140 to provide a partial view inside the prober 124). As shown, prober 124 can comprise a housing containing a moveable stage 138 for holding DUT 136, and a probe card assembly 132 can be attached to an insert plate 128, which can comprise an upper portion of the prober 124. To test DUT 136, DUT 136 can be placed on a moveable stage 138 as shown in FIG. 1, and the stage 138 can be moved such that terminals 142 of DUT 136 are brought into contact with probes 134 of a probe card assembly 132. Temporary electrical connections can thus be established between the probes 134 and DUT 136.

A cable 104 or other communication means (e.g., wireless link, fiber optic link, etc.) can connect a tester (not shown) with the test head 102. Electrical connectors 114 can electrically connect the test head 102 with the probe card assembly 132. The probe card assembly 132 can include a mounting structure 122 by which the probe card assembly 132 can be mounted to the insert plate 128 of the prober 124. For example, bolts 116 can secure the mounting structure 122—and thus probe card assembly 132—to the insert plate 128. Alternatively, other mechanisms (e.g., clamps) can secure the probe card assembly 132 to the insert plate 128 or other parts of the prober 124. An attachment structure 126 can attach (e.g., by bolts, differential screw assemblies, clamps, or other attachment mechanisms) a probe head assembly 130 to the mounting structure 122. The attachment structure 126 can include mechanisms for adjusting a tilt or planarity of the probe head assembly 130 (and thus contact ends or tips of the probes 134) with respect to the mounting structure 122. As shown, the probe head assembly 130 can extend into the interior of the prober 124 through an opening 131 in the insert plate 128.

The probe card assembly 132 can also include a wiring board to which the electrical connectors 114 are connected. For example, in FIG. 1, mounting structure 122 can be or can include a wiring board. Electrical connectors 114, at least part of which can be part of probe card assembly 132, can thus constitute an electrical interface to the test system 100. The probe card assembly 132 can include electrical paths (not shown) between electrical connectors 114 and the probes 134. The cable 104, test head 102, and electrical connectors 114 can thus provide electrical paths between the tester (not shown) and the probe card assembly 132, and the probe card assembly 132 can provide additional electrical paths from the electrical connectors 114 to the probes 134. Thus, while the probes 134 are in contact with terminals 142 of DUT 136, cable 104, test head 102, electrical connectors 114, and probe card assembly 132 can provide a plurality of electrical paths between the tester (not shown) and terminals 142 of DUT 136. The tester (not shown) can drive test signals (e.g., test data) through these electrical paths to input terminals 142 of DUT 136, and response signals (e.g., response data) generated by DUT 136 in response to the test signals can be sensed at output terminals 142 of DUT 136 and returned to the tester (not shown) through these electrical paths. The tester (not shown), which can be a computer or other electronics system, can compare the response signals to expected signals to determine whether DUT 136 passed the testing.

In some test scenarios, it can be advantageous to test DUT 136 at specific temperatures or over a range of temperatures. Heating elements or cooling elements (not shown) can be included in the stage 138 or at other locations in the prober 124 to heat or cool DUT 136 during testing. Even if heating elements or cooling elements (not shown) are not used, operation of DUT 136 may generate heat. Such heating or cooling from either heating/cooling elements (not shown) or from operation of DUT 136 can cause DUT 136 and/or all or part of the probe card assembly 132 to expand or contract, which can change the positions of the probes 134 relative to terminals 142 of DUT 136. This can cause misalignment between the probes 134 and terminals 142 in a plane that is generally horizontal in FIG. 1. This horizontal plane can be in the directions labeled "x, y" in FIG. 1 and will hereinafter be referred to as "x, y" movement. (In FIG. 1, the direction labeled "x" is horizontal across the page, the direction labeled "y" is horizontal into and out of the page, and the direction labeled "z" is vertical on the page. These directions are relative and for convenience and are not to be taken as limiting.) If such "x, y" misalignment becomes too great, some of the probes 134 may not contact some of the terminals 142.

The use of heating elements or cooling elements (not shown) to heat or cool DUT 136 during testing and/or the generation of heat by DUT 136 as it is tested, can also cause a thermal gradient between the side of the probe card assembly 132 that faces DUT 136 (hereinafter a side of the probe card assembly 132 that faces DUT 136 can be referred to as the "front-side" or the "wafer-side," which can be a non-limiting example of a first side) and the opposite side of the probe card assembly (hereinafter the opposite side of the probe card assembly can be referred to as the "back-side" or the "tester-side," which can be a non-limiting example of a second side). Such thermal gradients can cause all or part of the probe card assembly 132 to bow or warp. If such bowing is towards DUT 136, the probe card assembly 132 may press against DUT 136 with too much force and damage DUT 136 or probes 134. If such bowing is away from DUT 136, some or all of the probes 134 may move (in a generally vertical direction in FIG. 1) out of contact with some of the terminals 142 on DUT 136. If the probes 134 do not contact the terminals 142, DUT 136 can falsely test as failed. (Movement to or away from DUT 136 is labeled the "z" direction in FIG. 1 and will hereinafter be referred to as "z" movement.)

In some test scenarios, immediately following installation of a probe card assembly 132 in a prober 124, the probe card assembly 132 can undergo thermally induced movement. The movement stops (or is reduced sufficiently) and the position of the probe card assembly 132 stabilizes only after a sufficient temperature equilibrium is reached between the front-side and back-side of the probe card assembly 132. Of course, such an equilibrium need not be a perfect equilibrium in which the front-side temperature of the probe card assembly 132 exactly equals the back-side temperature; rather, the front-side temperature and the back-side temperature need only be sufficiently close that the structure of the probe card assembly 132 is able to resist thermal movement. The time required to reach such a temperature equilibrium or near equilibrium is often referred to as "thermal equilibrium time" or "thermal soak time."

Figure 2:
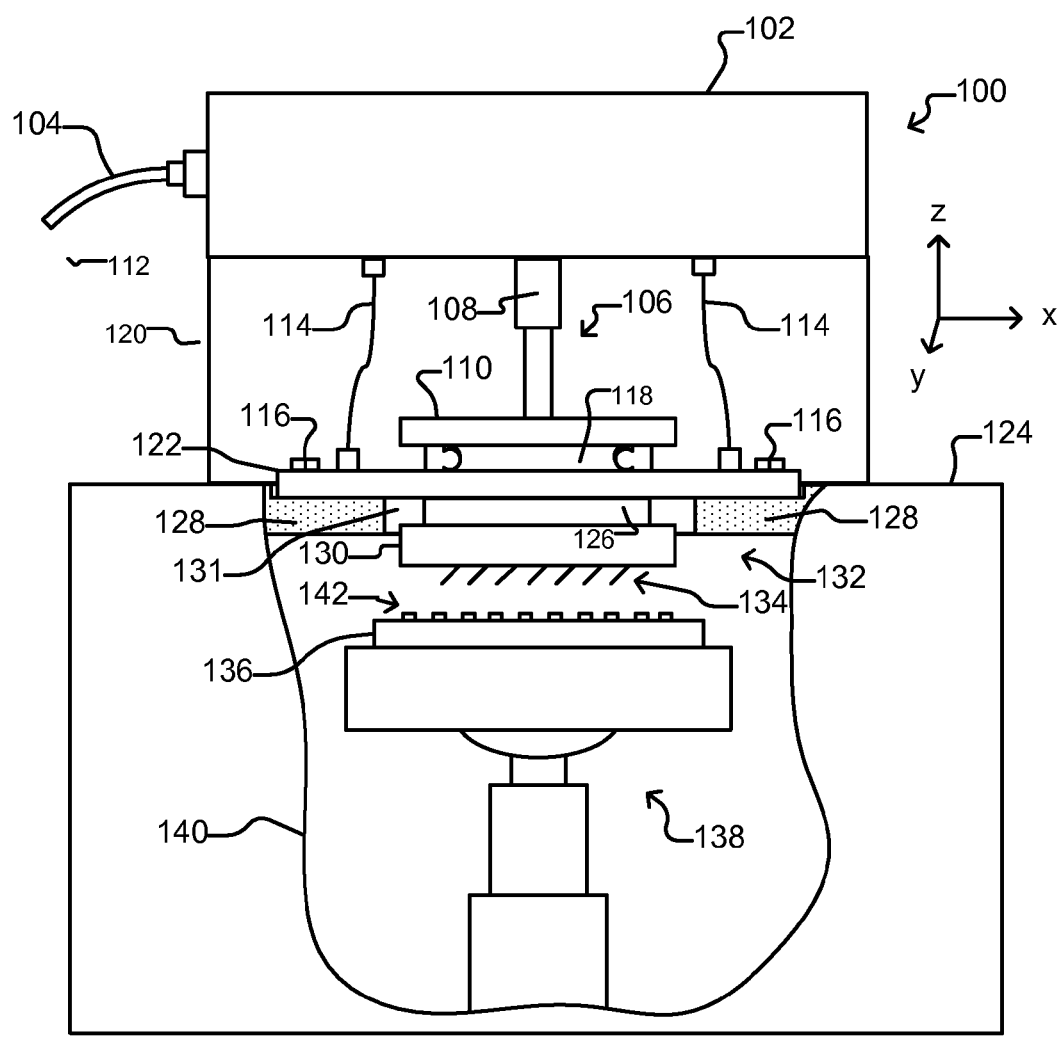
FIG. 2 illustrates the test system of FIG. 1 with the clamping mechanism in engagement with the mating structure.
Figure 3:
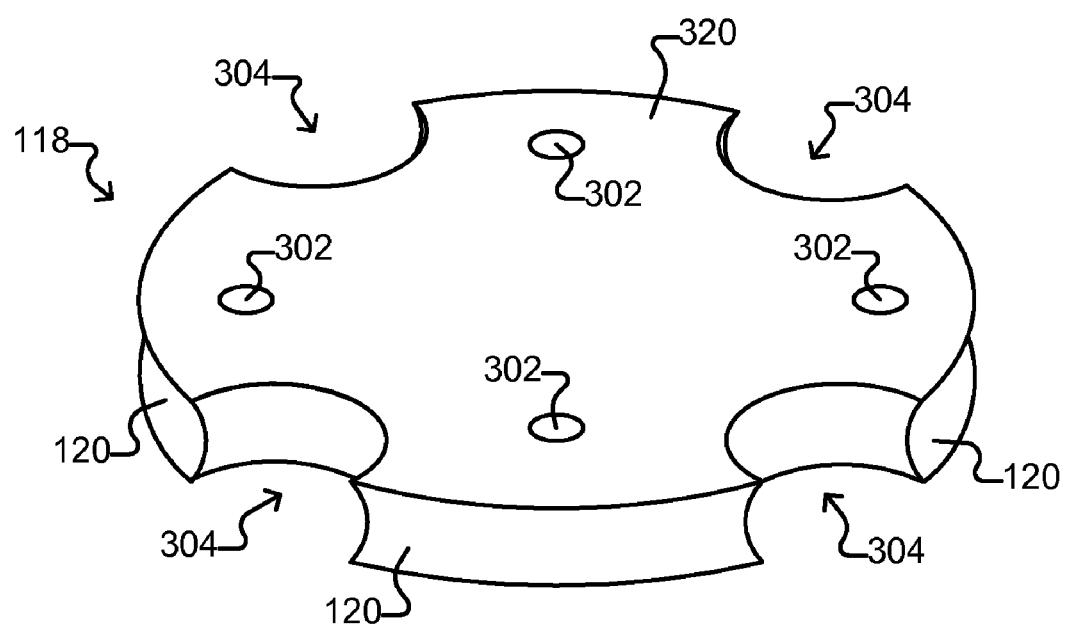
FIG. 3 illustrates a side, perspective view of an example of a mating structure in the test system of FIGS. 1 and 2 according to some embodiments of the invention.

Mechanisms can be utilized to manage the thermal conditions in and around the probe card assembly 132 during testing or the effects of the thermal conditions to eliminate, reduce, or minimize one or more of the foregoing effects. For example, the mounting structure 122 can include a structure that mechanically resists movement. FIGS. 1-3 illustrate another example in which a mating structure 118 is attached (e.g., bolted or clamped) to the probe card assembly 132 (e.g., to mounting structure 122). As shown in FIGS. 1 and 2, a clamping mechanism 106 can include a moveable portion 108 that can extend, retract, and/or otherwise move an engaging portion 110 into physical contact with the mating structure 118. For example, the engaging portion 110 can include a recess or extension that receives or fits into a corresponding extension or recess in the mating structure 118. As shown in the non-limiting example in FIGS. 1 and 2, engaging portion 110 can have extensions 112 (which can be a non-limiting example of a mating feature) that can be received into recess or recesses 120 (which can be a non-limiting example of a mating feature) in mating structure 118. The engaging portion 110 need not, however, include extensions 112, and mating structure 118 need not include corresponding recesses 120. For example, engaging portion 110 can alternatively simply be a plate like structure that is brought into contact with the top surface of mating structure 118. Clamping mechanism 106 can be a stiff structure that mechanically resists movement of the probe card assembly 132. The clamping mechanism 106 can thus resist and eliminate, reduce, or minimize movement of the probe card assembly 132—which can be thermally induced movement, for example, as discussed above or movement induced by other forces, such as the force of DUT 136 being moved by stage 138 into contact with probes 134. The clamping mechanism 106 can thus stiffen the probe card assembly 132.

A problem, however, can arise. One or more low-thermal-resistance paths can exist from inside the prober 124 through the probe card assembly 132 to outside the prober. In some embodiments, thermal resistance can be added or increased to impede the flow of thermal energy from inside the prober 124 through the probe card assembly 132 to outside the prober 124.

One example of a low-thermal-resistance path through the probe card assembly 132 is as follows: the mating structure 118 and the clamping mechanism 106 can form a low-thermal-resistance path from the back-side of the probe card assembly 132 to the test head 102 and/or the prober 124. Flow of thermal energy (e.g., heat) through the mating structure 118 and clamping mechanism 106 to the test head 102 and/or housing of the prober 124 can exacerbate one or more of the thermal problems discussed above. For example, the flow of thermal energy (e.g., heat) through the mating structure 118 and clamping mechanism 106 can cause the probe card assembly 132 to expand or contract laterally (in the "x, y" plane) by a different amount than DUT 136. As discussed above, this can cause at least some of probes 134 to become unaligned with the terminals 142 the probes 134 are intended to contact. The result can be that at least some of probes 134 do not contact any of terminals 142 or contact the wrong terminals 142. As another example, the flow of thermal energy (e.g., heat) through the mating structure 118 and clamping mechanism 106 can contribute to a vertical (in the "z" direction) thermal gradient that can cause the probe card assembly 132 to bow down, moving some of probes 134 toward DUT 136 (which as discussed above, can damage DUT 136 and/or probes 134), or bow up, moving some of probes 134 away from DUT 136 (which as discussed above, can move at least some of probes 134 out of contact with terminals 142). As yet another example, the flow of thermal energy (e.g., heat) through the mating structure 118 and clamping mechanism 106 can increase thermal soak time.

In some embodiments of the invention, the thermal conductivity of the interface between the mating structure 118 and the engaging portion 110 of the clamping mechanism 106 can be reduced. Put another way, the thermal resistance (which can be a non-limiting example of thermal resistance to thermal flow) of the interface between the mating structure 118 and the engaging portion 110 of the clamping mechanism 106 can be increased. Alternatively, or in addition, the thermal conductivity of the interface between the mating structure 118 and the probe card assembly 132 can be reduced, or the thermal resistance of the interface between the mating structure 118 and the probe card assembly 132 can be increased. There are many ways contemplated to reduce the thermal conductivity or increase the thermal resistance. Hereinafter, all references to reducing thermal conductivity include increasing thermal resistance, and all references to increasing thermal resistance include reducing thermal conductivity. Moreover, all references to increasing thermal resistance or reducing thermal conductivity encompass impeding thermal flow. Thus, any structure, mechanism, or configuration described herein as increasing the thermal resistance or reducing the thermal conductivity of an element impedes thermal flow through the element.

Figure 4:
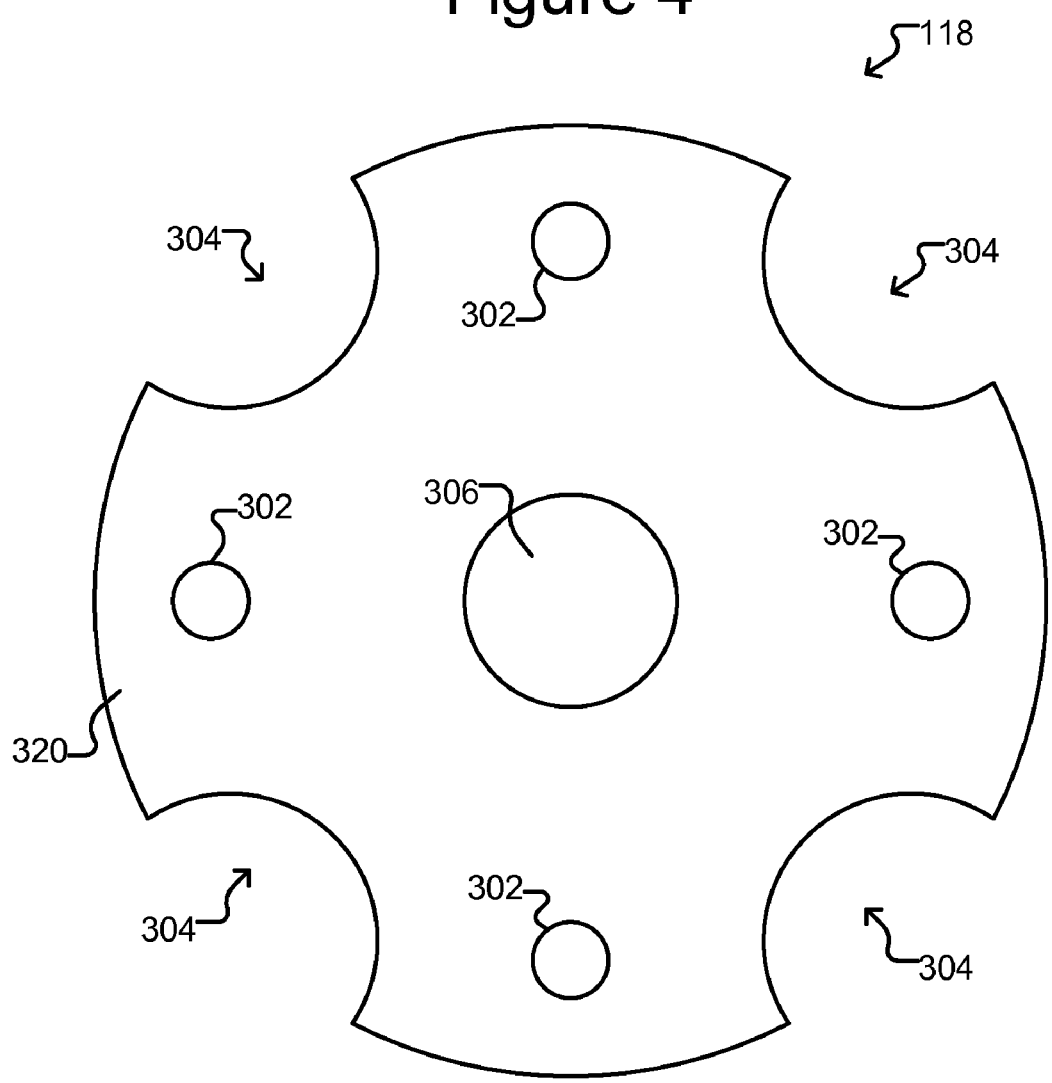
FIG. 4 illustrates a top view of the mating structure of FIG. 3.

In some embodiments, the thermal resistance of the interface between the mating structure 118 and the engaging portion 110 can be increased by decreasing the area of physical contact between the mating structure 118 and the engaging portion 110. FIGS. 3 and 4 illustrate an example of mating structure 118, which as shown, can be a plate-like structure in some embodiments. The mating structure 118 can comprise metal or other mechanically strong materials. Holes 302 for bolts or other mechanisms for attaching mating structure 118 to mounting structure 122 can be provided through the mating structure 118. When attached to mounting structure 122, a bottom surface 322 of the mating structure 118 can be in contact with the mounting structure 122. A top surface 320 of the mating structure 118 can be contacted by engaging portion 110 of clamping mechanism 106 (see FIGS. 1 and 2).

As shown, mating structure 118 can include cutouts 304 and/or 306 according to some embodiments. Mating structure 218 can be a plate-like structure, and can be made of material suitable for establishing a mechanical connection with clamping mechanism 106. For example, mating structure 118 can comprise metal, ceramic, hard plastic, etc.

The cutouts 304 and/or 306 (or openings) in the mating structure 118 (or in top surface 320) can reduce the surface area of a top surface 320 and the bottom surface 322. As can be seen in FIGS. 3 and 4, cutouts 304 can comprise openings disposed along a perimeter of top surface 320 of mating structure 118, and cutout 306 can comprise an opening within a perimeter of top surface 320 of mating structure 118. Although one cutout 306 is shown, more than one cutout 306 comprising an opening within a perimeter of top surface 320 can be included. Cutouts 304 and 306 can reduce the area of surface 320, which can reduce the area of physical contact between the engaging portion 110 of the clamping mechanism 106 and the mating structure 118, which can increase the thermal resistance between the engaging portion 110 of the clamping mechanism 106 and the mating structure 118. Similarly, cutouts 304 and 306 can decrease the area of the bottom surface 322 of mating structure 118, which can reduce the area of physical contact between the mounting structure 122 and the mating structure 118. This can increase the thermal resistance between the mounting structure 122 and the mating structure 118. Cutouts 304 and/or 306 can thus impede thermal flow from mounting structure 122 to mating structure 118 and/or from mating structure 118 to clamping mechanism 106.

Figure 5:
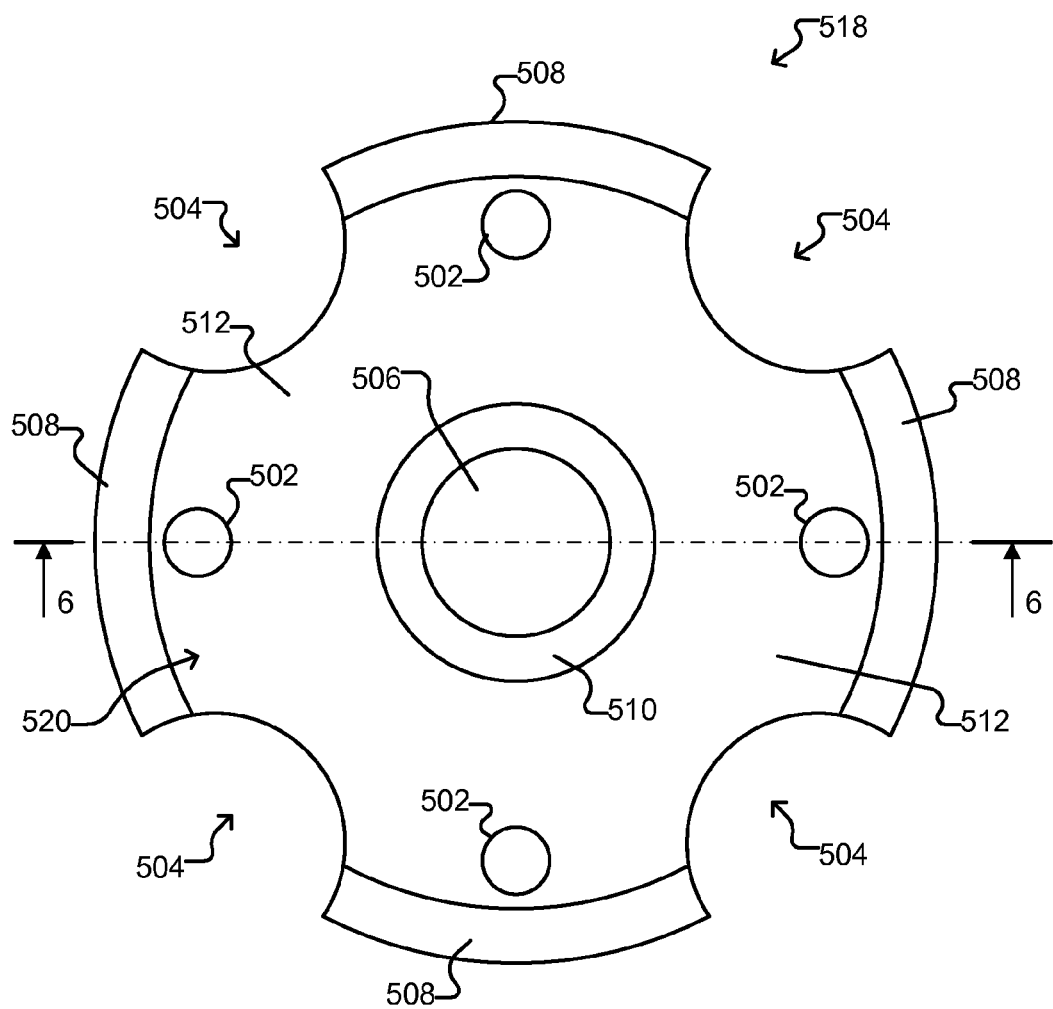
FIG. 5 illustrates a top view.
Figure 6:
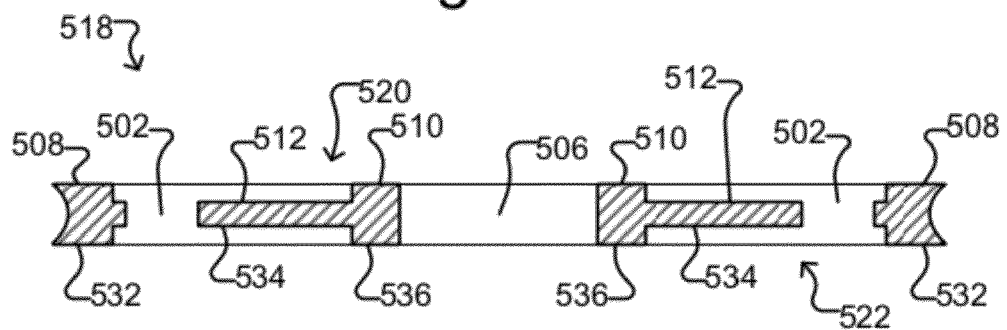
FIG. 6 illustrates a side, cross-sectional view of another example of a mating structure according to some embodiments of the invention.

FIG. 5 shows a top view and FIG. 6 shows a side, cross-sectional view of another exemplary mating structure 518 according to some embodiments of the invention. Mating structure 518—which can be a plate-like structure in some embodiments—can be generally like mating structure 118 except as discussed below. Mating structure 518 can replace mating structure 118 in the test system 100 of FIGS. 1 and 2. For example, bolts or other securing mechanisms can pass through holes 502 to secure mating structure 518 to mounting structure 122.

As shown in FIGS. 5 and 6, a portion 512 of the top surface 520 (which can be a non-limiting example of a first surface) of the mating structure 518 can be recessed such that only non-recessed portions 508, 510 physically contact engaging portion 110 of clamping mechanism 106. The recessing of recessed portion 512 of the top surface 520 of the mating structure 518 can decrease the area of top surface 520 that contacts the engaging portion 110, increasing the thermal resistance between the mating structure 518 and the clamping mechanism 106. Recessed portion 512 can impede thermal flow from mating structure 518 to clamping mechanism 106. As can be seen in FIG. 6, a portion 534 of the bottom surface 522 (which can be a non-limiting example of a second surface) of the mating structure 518 can also be recessed such that only non-recessed portions 532, 536 physically contact the mounting structure 122. The recessing of recessed portion 534 of the bottom surface 522 of the mating structure 518 can decrease the area of the bottom surface 522 that contacts the mounting structure 122, increasing the thermal resistance between the mating structure 518 and the mounting structure 122. The recessing of recessed portion 534 of the bottom surface 522 of the mating structure 518 can thus impede thermal flow between the mounting structure 122 and the mating structure 518.

As shown in FIG. 5, mating structure 518 can optionally also include cutouts 504, 506, which can be like cutouts 304, 306 of mating structure 118 of FIGS. 3 and 4. As can be seen in FIG. 5, cutouts 504 can comprise openings disposed along a perimeter of top surface 520 of mating structure 518, and cutout 506 can comprise an opening within a perimeter of top surface 520 of mating structure 518. Although one cutout 506 is shown, more than one cutout 506 comprising an opening within a perimeter of top surface 520 can be included. For the reasons discussed above with respect to FIGS. 3 and 4, the cutouts 504, 506 can increase the thermal resistance between the mating structure 518 and the clamping mechanism 106 and between the mating structure 518 and the probe card assembly 132. Cutouts 504 and/or 506 can impede thermal flow from mating structure 518 to clamping mechanism 106 and/or from mounting structure 122 to mating structure 518. Alternatively, mating structure 518 need not have cutouts 504, 506.

The exemplary mating structures 118 and 518 in FIGS. 3-6 are exemplary only, and many variations are possible. For example, the number, shapes, and placements of cutouts 304, 306 in FIGS. 3 and 4 are exemplary only, and any other number, shapes, and placements of cutouts 304, 306 can be used. Similarly, the number, shapes, and placements of cutouts 504, 506 in FIGS. 5 and 6 are exemplary only, and any other number, shapes, and placements of cutouts 504, 506 can be used. As another example, the number, shapes, and placement of recessed portions 512, 534 and non-recessed portions 508, 510, 532, and 536 is exemplary only, and any number, shapes, and placement can be used. As yet another example, the overall circular shape of mating structures 118 and 518 is exemplary, and other shapes (e.g., oval, square, rectangular, etc.) can be used. As yet another example, all or part of the surface of the engaging portion 110 that corresponds to—and thus engages—the top surface 320 of mating structure 118 can alternatively or additionally be configured generally like top surface 320 of mating structure 118 as, for example, shown in FIGS. 3 and 4 or the top surface 520 of the mating structure 518 as, for example, shown in FIG. 5. Likewise, alternatively or in addition, all or part of a surface of the probe card assembly 132 that corresponds to—and thus engages—the bottom surface 322 of mating structure 118 can alternatively or additionally be configured generally like the bottom surface 322 of mating structure 118 as, for example, shown in FIGS. 3 and 4 or the bottom surface 522 of the mating structure 518 as, for example, shown in FIG. 5.

Figure 7:
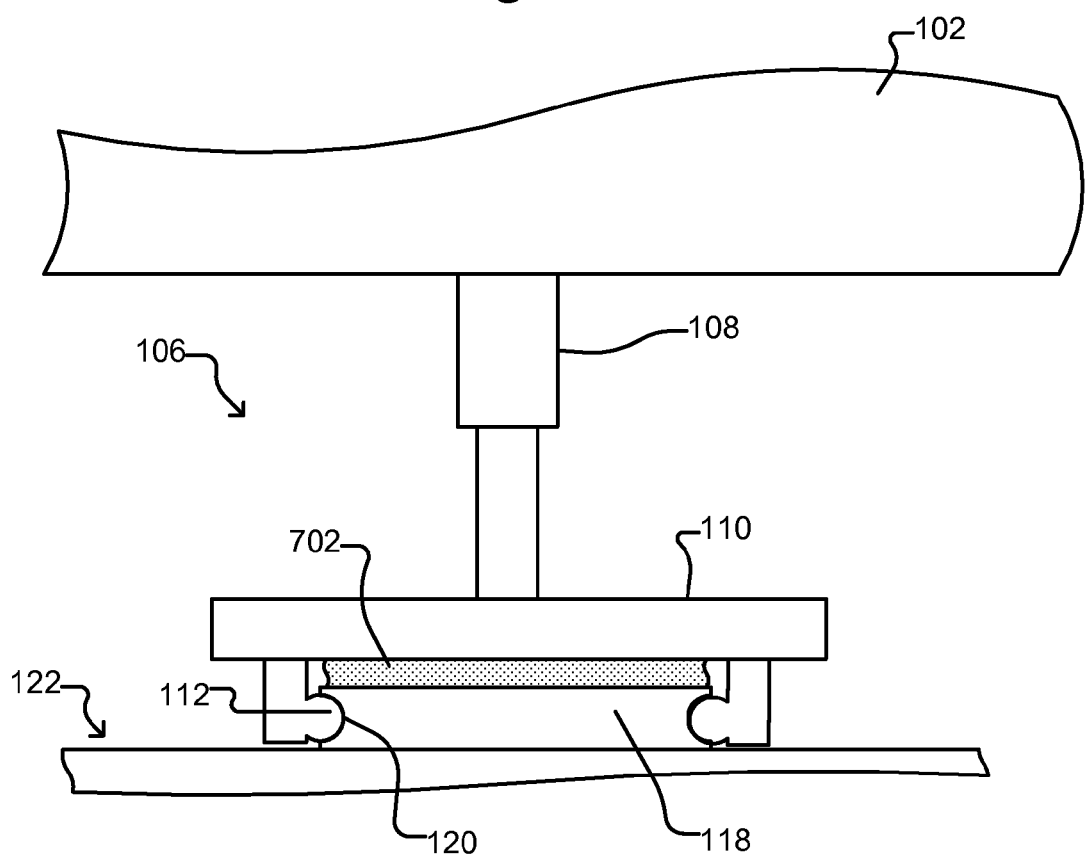
FIG. 7 illustrates use of insulating material to increase thermal resistance between the mating structure and the clamping structure according to some embodiments of the invention.

In some embodiments, the thermal resistance of the interface between the mating structure 118 and the engaging portion 110 can be increased by placing thermally insulating material between the mating structure 118 and the engaging portion 110 that has a greater thermal resistance than the material or materials of which the mating structure 118 and/or the engaging portion 110 are made. For example, thermal insulating material can be placed between the engaging portion 110 and the mating structure 118 as shown in FIG. 7. Thermal insulating material 702 can impede thermal flow from mating structure 118 to clamping mechanism 106. Although not shown in FIG. 7, the thermal resistance of the interface between the mating structure 118 and the mounting structure 122 can similarly be increased by placing thermally insulating material (not shown but can be like material 702) between the mating structure 118 and the mounting structure 122. As yet another example of a variation, thermally insulating material (not shown but can be like material 702) can be embedded in mating structure 118. Thus, for example, material 702 can be inside mating structure 118 in FIG. 7 rather than or in addition to being on the top surface 320 of mating structure 118.

Figure 8:
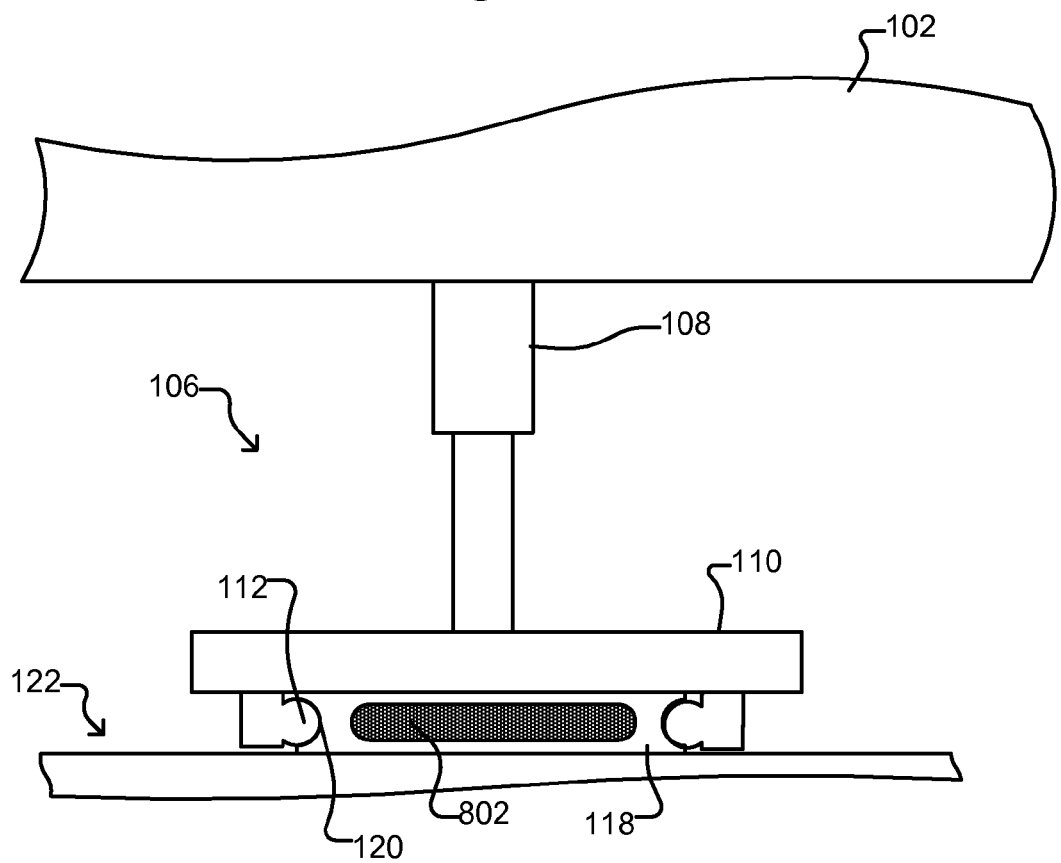
FIG. 8 illustrates use of a heat sinking mechanism to increase thermal resistance between the mating structure and the clamping structure according to some embodiments of the invention.

In some embodiments, the thermal resistance of the interface between the mating structure 118 and the engaging portion 110 can be increased by placing a heat sinking mechanism or mechanisms on the mating structure 118. For example, heat sinking mechanism(s) 802 can be placed on and/or embedded within mating structure 118 as shown in FIG. 8. The heat sinking mechanism(s) 802 can increase the thermal resistance of the interface between the mating structure 118 and the clamping mechanism 106. Heat sinking mechanism 802 can be any mechanism that sinks heat. For example, heat sinking mechanism 802 can be a radiator structure. As another non-limiting example, heat sinking mechanism 802 can be a heat pump. Heat sinking mechanism 802 can impede thermal flow from mating structure 118 to clamping mechanism 106.

Although not shown in FIG. 8, a heat sinking mechanism(s) (not shown but can be like heat sinking mechanism 802) can alternatively or additionally be on and/or within the engaging portion 110 and/or the probe card assembly 132 (e.g., on and/or within the mounting structure 122 or any structure of the probe card assembly 132 to which the mating structure 118 is attached).

In some embodiments, a mating structure like the mating structure 118 of FIGS. 3 and 4 but without cutouts 304, 306 can be used with thermal insulating material 702 and/or heat sinking mechanism(s) 802. For example, a mating structure like mating structure 118 of FIGS. 3 and 4 but without cutouts 304, 306 can replace mating structure 118 in FIG. 7, and as discussed above, thermal insulating material 702 can alternatively or additionally be embedded within such a mating structure and/or placed between such a mating structure and mounting structure 122. As another example of a variation, mating structure 518 of FIG. 5 can replace mating structure 118 in FIG. 7, and as discussed above, thermal insulating material 702 can alternatively or additionally be embedded within mating structure 518 and/or placed between mating structure 518 and mounting structure 122. As other examples, mating structure 118 of FIGS. 3 and 4 or mating structure 518 of FIG. 5 can replace mating structure 118 in FIG. 8, and as discussed above, heat sinking mechanism(s) 802 can be on and/or in mating structure 118 or 518. Moreover, as discussed above, heat sinking mechanism(s) 802 can alternatively or additionally be on and/or in engaging portion 110 and/or the probe card assembly 132. As yet further examples of variations, insulating material 702 can be placed between engaging portion 110 and mating structure 118 (or mating structures 518 if mating structure 518 replaces mating structure 118 in FIG. 8) and/or between mating structure 118 (or mating structures 518 if mating structure 518 replaces mating structure 118 in FIG. 8) and probe card assembly 132 in FIG. 8. Thus, any combination of two or more of the exemplary techniques illustrated in FIGS. 3-8 can be used together to increase the thermal resistance of the interface between the engaging portion 110 and the mating structure 118 and/or between the mating structure 118 and the probe card assembly 132.

The exemplary embodiments illustrated herein, including any modifications discussed herein, can be used to increase a thermal resistance to a flow of thermal energy (e.g., heat) from the probe card assembly 132 (e.g., the wafer-side of the probe card assembly 132) through the mating mechanism 118 or 518 and the clamping mechanism 106. The embodiments illustrated herein can also be used to tune the thermal resistance to control the flow of thermal energy from the probe card assembly 132 (e.g., the wafer-side of the probe card assembly 132) through the mating mechanism 118 or 518 and the clamping mechanism 106. The thermal resistance can be tuned to achieve any number of desired results. For example, thermal resistance can be tuned to achieve a flow of thermal energy from the wafer-side of the probe card assembly 132 in the system of FIGS. 1 and 2 through the probe card assembly 132, mating structure 118 (or 518) and the clamping mechanism 106 to achieve the same or substantially the same rate of expansion or contraction (e.g., in the "x, y" plane) of spacing between probes 134 as the rate of expansion or contraction of the spacing between terminals 142 so that probes 134 stay aligned or substantially aligned with terminals 142 even as DUT 136 (which can be a non-limiting example of electronic devices to be tested) and the probe card assembly 132 expand or contract due to changing thermal conditions. This can be accomplished by taking into consideration the coefficient of thermal expansion of DUT 136 (which can be made of, for example, silicon or another semiconductor material) and the coefficient of thermal expansion of a part or parts of the probe card assembly 132 that affect the positions of the probes 134. For example, the thermal resistance between the probe card assembly 132 and the mating structure 118 and/or the thermal resistance between the mating structure 118 and the engaging portion 110 can be tuned so that a flow of thermal energy from DUT 136 through the probe card assembly 132 and clamping mechanism 106 is such that DUT 136 and the part or parts of the probe card assembly 132 that affect positions of the probes 134 expand or contract at the same or substantially the same rate.

FIGS. 3-9 illustrate examples of techniques for increasing thermal resistance between the probe card assembly 132 and the prober 124 (see FIGS. 1 and 2) through the mating structure 118 and clamping mechanism 106. Another example of a low-thermal-resistance path from inside the prober 124 through the probe card assembly 132 to outside the prober 124 is as follows: the mounting structure 122 and the insert plate 128 of the prober 124 can form a low-thermal-resistance path from inside the prober 124 to outside the prober. Flow of thermal energy (e.g., heat) through the mounting structure 122 and insert plate 128 to outside the prober 124 can exacerbate one or more of the thermal problems discussed above.

Figure 9:
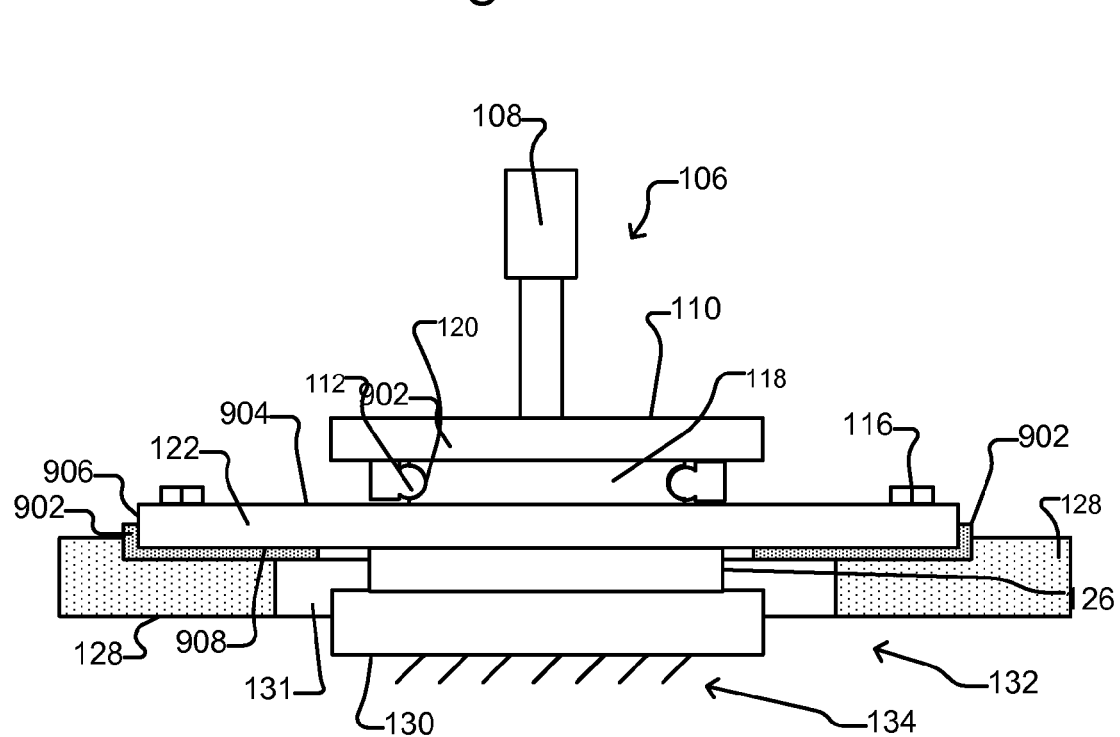
FIG. 9 illustrates thermally insulating material between the probe card assembly and the insert plate of the prober of the system of FIGS. 1 and 2 according to some embodiments of the invention.
Figure 10A:
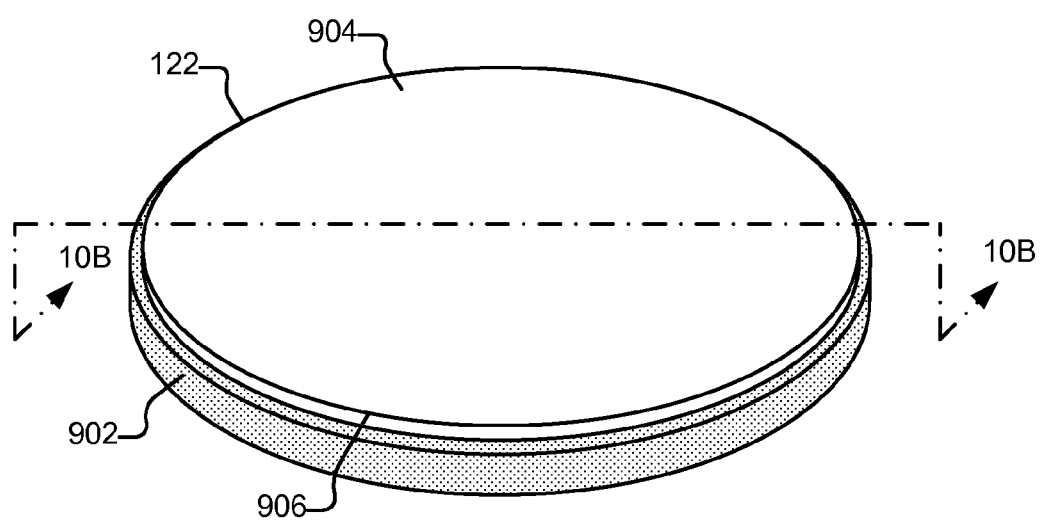
FIGS. 10A and 10B illustrate a side perspective view and a side cross sectional view, respectively, of the mounting structure and insulating material from FIG. 9.
Figure 10B:
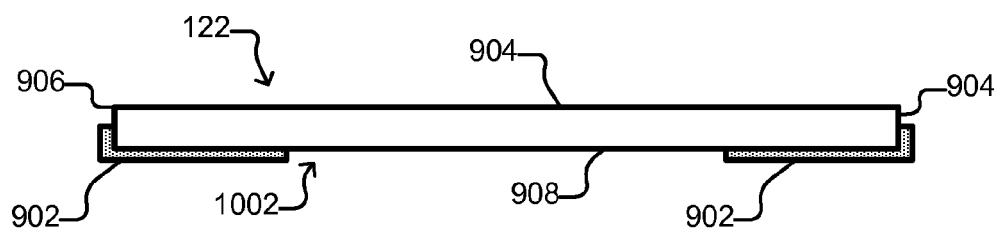

FIG. 9 illustrates an example of a technique for increasing thermal resistance between the mounting structure 122 and the insert plate 128 in which thermally insulating material 906 is provided between the mounting structure 122 and the insert plate 128. Thermally insulating material 902 can be any material that resists the flow of thermal energy (e.g., heat). In some embodiments material 902 can have a greater thermal resistance than the material or materials of which the mounting structure 122 and/or the insert plate 128 are made As shown in FIG. 9, insulating material 902 can be provided between portions (e.g., some, most, or all) of the probe card assembly 132 that contact the insert plate 128 of the prober 128. FIGS. 10A and 10B illustrate a side-perspective view and side-cross sectional view, respectively, of the mounting structure 122 with insulating material 902. As can be seen, insulating material 902 can cover portions of the side walls 906 and bottom surface 908 of the mounting structure 122 that contact the insert plate 128 of the prober 124. Insulating material 902 can thus impede the flow of thermal energy—and thus increase the thermal resistance—between the mounting structure 122 and the insert plate 128. As shown in FIG. 10B, an opening 1002 can be provided in insulating material 902 on the bottom surface 908 of the mounting structure 122 to allow attachment structure 126 to connect to the bottom surface 908 of mounting structure 122.

Figure 11:
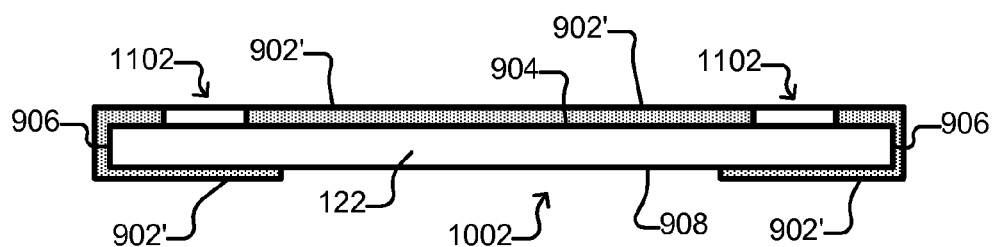
FIG. 11 illustrates the cross-sectional view of FIG. 10B showing the insulating material on an upper surface of the mounting structure.

FIG. 11 illustrates mounting structure 122 with insulating material 902 on the top surface 904 of the mounting structure 122. This can reduce the rate at which the probe card assembly 132 radiates heat from inside the prober 132 to outside the prober. As shown, openings 1102 can be provided in the insulating material 902 on the top surface 904 of the mounting structure 122 to allow for such things as electrical connectors 114 and bolts 116 (see FIGS. 1 and 2). Although insulating material 902 is shown in FIG. 11 on the top surface 904, the side walls 906, and the bottom surface 908 of the mounting structure 122, insulating material 902 can alternatively be provided only on the top surface 904 of mounting structure 122.

Although specific embodiments and applications of the invention have been described in this specification, these embodiments and applications are exemplary only, and many variations are possible.

We claim:

1. A probe card assembly for use in a test system for testing electronic devices, the probe card assembly comprising:
   a wiring substrate;
   an electrical interface to the test system, wherein the electrical interface is disposed on the wiring substrate;
   a probe substrate coupled to the wiring substrate;
   a plurality of probes extending from the probe substrate, wherein the probes are configured to contact terminals of the electronic devices in the test system while the probe card assembly is attached to the test system, wherein the probes are electrically connected through the probe substrate and the wiring substrate to the electrical interface; and
   means for impeding thermal flow from the probe card assembly to the test system at each place of physical contact other than at the electrical interface between the probe card assembly and the test system while the probe card assembly is attached to the test system.

2. The probe card assembly of claim 1 further comprising a mounting structure configured to attach the probe card assembly to an upper portion of a prober in which the electronic devices are disposed, wherein:
the mounting structure comprises the wiring substrate, and
the means for impeding comprises thermally insulating material disposed on portions of the mounting structure that contact the upper portion of the prober while the mounting structure is attached to the test system.

3. The probe card assembly of claim 2 further comprising insulating material disposed on an upper surface of the mounting structure that faces away from the prober while the mounting structure is attached to the prober.

4. A probe card assembly for use in a test system for testing electronic devices, the probe card assembly comprising:
an electrical interface to the test system;
a plurality of probes disposed at a first side of the probe card assembly, wherein the probes are configured to contact terminals of the electronic devices in the test system while the probe card assembly is attached to the test system, wherein the probes are electrically connected to the electrical interface;
means for impeding thermal flow from the probe card assembly to the test system at each place of physical contact between the probe card assembly and the test system while the probe card assembly is attached to the test system;
a mounting structure configured to attach the probe card assembly to an upper portion of a prober in which the electronic devices are disposed, wherein the means for impeding comprises thermally insulating material disposed on portions of the mounting structure that contact the upper portion of the prober while the mounting structure is attached to the test system;
insulating material disposed on an upper surface of the mounting structure that faces away from the prober while the mounting structure is attached to the prober; and
a mating structure disposed at a second side of the probe card assembly that is opposite the first side, the mating structure configured to mechanically engage with a clamping mechanism of the test system and thereby mechanically stiffen the probe card assembly, wherein the means for impeding further impedes thermal flow from the mating structure to the clamping mechanism.

5. The probe card assembly of claim 4, wherein:
the mating structure comprises a first surface that faces the clamping mechanism, and
the means for impeding further comprises a plurality of cutouts in the first surface of the mating structure.

6. The probe card assembly of claim 5, wherein the cutouts comprise at least one opening in the mating structure disposed within a perimeter of the first surface.

7. The probe card assembly of claim 6, wherein the cutouts further comprise a plurality of openings in the mating structure disposed along the perimeter of the first surface.

8. The probe card assembly of claim 7, wherein the means for impeding thermal flow comprises at least one recess in the first surface of the mating structure.

9. The probe card assembly of claim 8, wherein the mating structure is attached to the mounting structure such that a second surface of the mating structure opposite the first surface faces the mounting structure, wherein the second surface comprises at least one recess and only non-recessed portions of the second surface physically contact the mounting structure.

10. A probe card assembly for use in a test system for testing electronic devices, the probe card assembly comprising:
an electrical interface to the test system;
a plurality of probes disposed at a first side of the probe card assembly, wherein the probes are configured to contact terminals of the electronic devices in the test system while the probe card assembly is attached to the test system, wherein the probes are electrically connected to the electrical interface;
a mating structure disposed at a second side of the probe card assembly opposite the first side, the mating structure configured to mechanically engage with a clamping mechanism of the test system and thereby mechanically stiffen the probe card assembly; and
means for impeding thermal flow from the mating structure to the clamping mechanism.

11. The probe card assembly of claim 10, wherein the mating structure comprises a first surface that faces the clamping mechanism, and the means for impeding thermal flow comprises a plurality of cutouts in the first surface of the mating structure.

12. The probe card assembly of claim 11, wherein the cutouts comprise at least one opening in the mating structure disposed within a perimeter of the first surface.

13. The probe card assembly of claim 12, wherein the cutouts further comprise a plurality of openings in the mating structure disposed along the perimeter of the first surface.

14. The probe card assembly of claim 10, wherein the mating structure comprises a first surface that faces the clamping mechanism, and the means for impeding thermal flow comprises at least one recess in the first surface of the mating structure.

15. The probe card assembly of claim 14, wherein the first surface of the mating structure comprises non-recessed portions that protrude from the recessed portions such that, while the non-recessed portions are in physical contact with the clamping mechanism, the recessed portions are not in physical contact with the clamping mechanism.

16. The probe card assembly of claim 15 further comprising a mounting structure configured to be attached to the test system, wherein the mating structure is attached to the mounting structure such that a second surface of the mating structure opposite the first surface faces the mounting structure, wherein the second surface comprises at least one recess and only non-recessed portions of the second surface physically contact the mounting structure.

17. The probe card assembly of claim 14, wherein the means for impeding thermal flow comprises a plurality of cutouts in the first surface of the mating structure.

18. The probe card assembly of claim 10, wherein the mating structure comprises a first surface that faces the clamping mechanism, and the means for impeding thermal flow comprises thermally insulating material disposed between the first surface and the clamping mechanism.

19. A test system for testing electronic devices, the test system comprising:
a housing in which the electronic devices are disposed;
a test head disposed above the housing and comprising electronics for testing the electronic devices;
a probe card assembly attached to the housing and electrically connected to the test head, the probe card assembly comprising a plurality of probes disposed at a first side of the probe card assembly and configured to contact terminals of the electronic devices, the probe card assembly further comprising a mating structure disposed at a second side of the probe card assembly opposite the first side;

a clamping mechanism extending from the test head to engage the mating structure and thereby mechanically stiffen the probe card assembly; and means for impeding thermal flow from the mating structure to the clamping mechanism.

20. The test system of claim 19, wherein:

the mating structure comprises a first surface that faces the clamping mechanism and a second surface opposite the first surface, the mating structure further comprising at least one mating feature; and the clamping mechanism is moveable toward and away from the mating structure, and the clamping mechanism includes at least one moveable mating feature for engaging the at least one mating feature of the mating structure.

21. The test system of claim 20, wherein the means for impeding thermal flow comprises a plurality of cutouts in the first surface of the mating structure.

22. The test system of claim 21, wherein the cutouts comprise at least one opening in the mating structure disposed within a perimeter of the first surface.

23. The test system of claim 22, wherein the cutouts further comprise a plurality of openings in the mating structure disposed along the perimeter of the first surface.

24. The test system of claim 20, wherein the means for impeding thermal flow comprises at least one recess in the first surface of the mating structure.

25. The test system of claim 24, wherein the first surface of the mating structure comprises non-recessed portions that protrude from the at least one recess such that, while the non-recessed portions are in physical contact with the clamping mechanism, the at least one recess is not in physical contact with the clamping mechanism.

26. The test system of claim 25, wherein the second surface of the mating structure comprises at least one recess.

27. The test system of claim 26, wherein the means for impeding thermal flow comprises a plurality of cutouts in the first surface of the mating structure.

28. The test system of claim 19, wherein the means for impeding thermal flow comprises thermally insulating material disposed between the first surface and the clamping mechanism.

* * * * *